(12) United States Patent
Wang et al.

(10) Patent No.: US 11,600,664 B2
(45) Date of Patent: Mar. 7, 2023

(54) MEMORY DEVICES AND METHODS OF FORMING MEMORY DEVICES

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Eng Huat Toh, Singapore (SG); Benfu Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 172 days.

(21) Appl. No.: 16/744,223

(22) Filed: Jan. 16, 2020

(65) Prior Publication Data
US 2021/0225936 A1 Jul. 22, 2021

(51) Int. Cl.
*H01L 45/00* (2006.01)
*H01L 27/24* (2006.01)

(52) U.S. Cl.
CPC ...... *H01L 27/2463* (2013.01); *H01L 45/1233* (2013.01); *H01L 45/1253* (2013.01); *H01L 45/146* (2013.01); *H01L 45/1608* (2013.01)

(58) Field of Classification Search
CPC ............. H01L 45/1273; H01L 45/1233; H01L 27/2463
See application file for complete search history.

(56) References Cited

U.S. PATENT DOCUMENTS

| 7,560,723 | B2 | 7/2009 | Liu |
| 7,952,087 | B2 | 5/2011 | Czubatyj et al. |
| 9,112,148 | B2 | 8/2015 | Chang et al. |
| 9,431,604 | B2 | 8/2016 | Liao et al. |
| 9,608,204 | B2 * | 3/2017 | Lee ...................... H01L 45/1683 |
| 9,865,814 | B2 * | 1/2018 | Fest ...................... H01L 45/085 |
| 10,847,720 | B1 | 11/2020 | Loy et al. |
| 2015/0069316 | A1 | 3/2015 | Lee et al. |
| 2015/0340606 | A1 | 11/2015 | Tada et al. |
| 2017/0117463 | A1 | 4/2017 | Chen |
| 2018/0138403 | A1 | 5/2018 | Chang et al. |
| 2021/0020834 | A1 | 1/2021 | Loy et al. |

OTHER PUBLICATIONS

Wei et al., "Highly Reliable TaOx ReRAM and Direct Evidence of Redox Reaction Mechanism", 2008 IEEE International Electron Devices Meeting, 2008, 4 pages, IEEE.
Chen et al., "Variability of Resistive Switching Memories and Its Impact on Crossbar Array Performance", 2011 International Reliability Physics Symposium, 2011, 4 pages, IEEE.

(Continued)

*Primary Examiner* — Mark V Prenty
(74) *Attorney, Agent, or Firm* — Viering Jentschura & Partner MBB

(57) ABSTRACT

A memory device may be provided, including a substrate; one or more bottom electrodes arranged over the substrate; one or more switching layers arranged over the one or more bottom electrodes; and a plurality of top electrodes arranged over the one or more switching layers. Each of the one or more bottom electrodes may include at least one corner tip facing the switching layer, and an angle of each of the at least one corner tip may be less than ninety degrees.

20 Claims, 15 Drawing Sheets

(56) References Cited

OTHER PUBLICATIONS

Nakayama, "ReRAM technologies: Applications and outlook", 2017 IEEE International Memory Workshop (IMW), 2017, 4 pages, IEEE.
Tkachev, "Field-Induced Generation of Electron Traps in the Tunnel Oxide of Flash Memory Cells", 2015 IEEE International Integrated Reliability Workshop (IIRW), 2015, pp. 99-102, IEEE.
Chuang et al., "Effects of Electric Fields on the Switching Properties Improvements of RRAM Device With a Field-Enhanced Elevated-Film-Stack Structure", Journal of the Electron Devices Society, 2018, pp. 622-626, vol. 6, IEEE.
Niu et al., "Geometric conductive filament confinement by nanotips for resistive switching of HfO2-RRAM devices with high performance", Scientific Reports, 2016, 9 pages, 6:25757.
Feng et al., "Investigation of switching mechanism in HfOx-ReRAM under low power and conventional operation modes", Scientific Reports, 2016, 8 pages, 6:39510.
Loy et al., "Nearest Neighbor Hopping in High Retention MgO-based Resistive Switching Devices in the High Resistance State", Abstract submitted to MRS (Materials Research Society) Spring Meeting & Exhibit, Apr. 22-26, 2019.
Mehr et al., "Ultra sharp crystalline silicon tip array used as field emitter", Microelectronic Engineering, 1996, 4 pages, 30, Elsevier.
Platzgummer et al., "Electron multibeam technology for mask and wafer writing at 0.1 nm address grid", Journal of Micro/Nanolithography, MEMS, and MOEMS, 2013, 9 pages, SPIE.
Non-Final Office Action received for U.S. Appl. No. 16/882,795, dated Mar. 24, 2022, 20 pages (Reference Purpose Only).
Non-final Office Action received for U.S. Appl. No. 16/513,745, dated Dec. 10, 2020, 25 pages (Reference Purpose Only).

\* cited by examiner

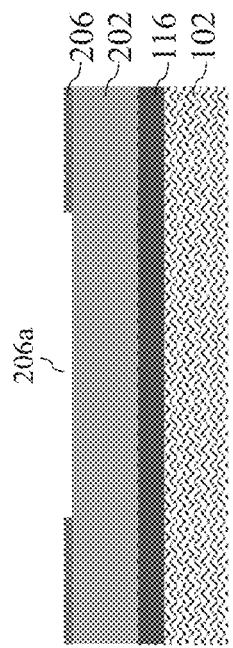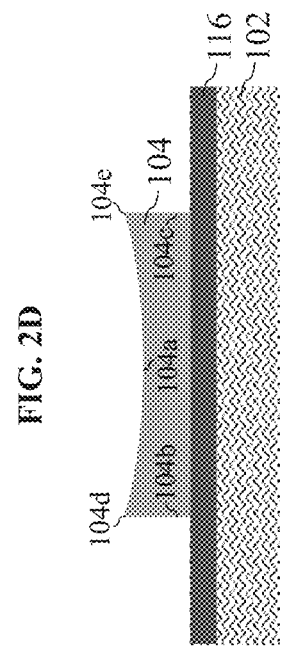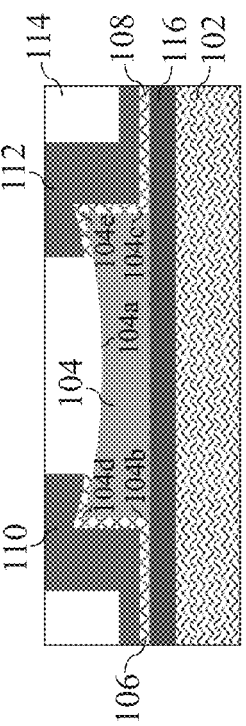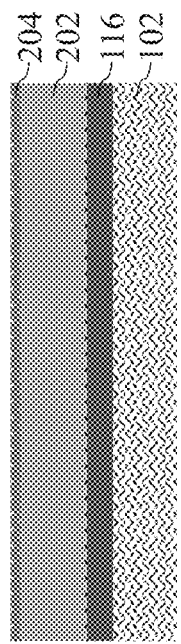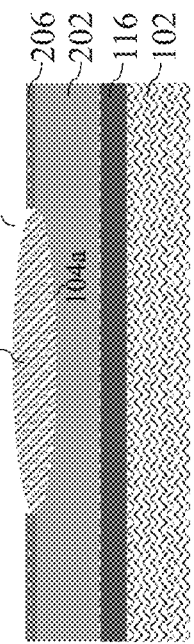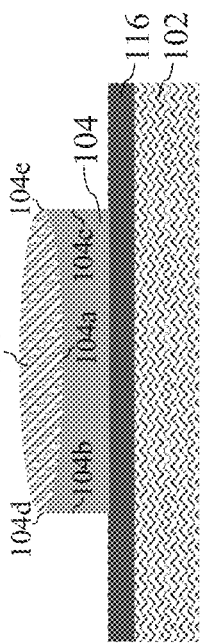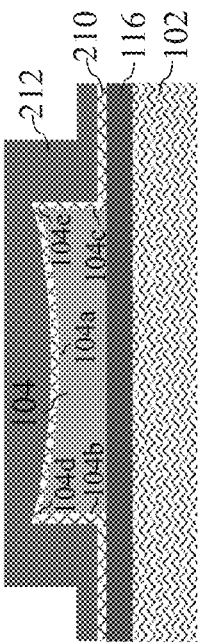

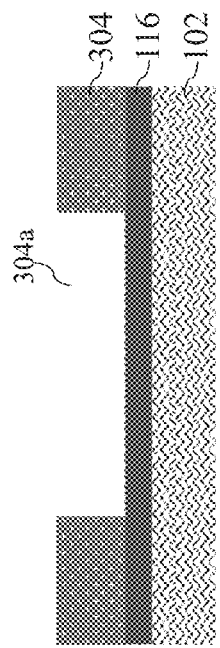
FIG. 3A
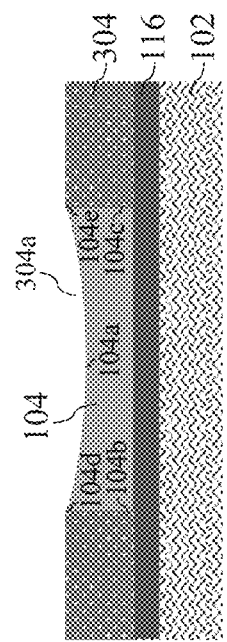
FIG. 3C
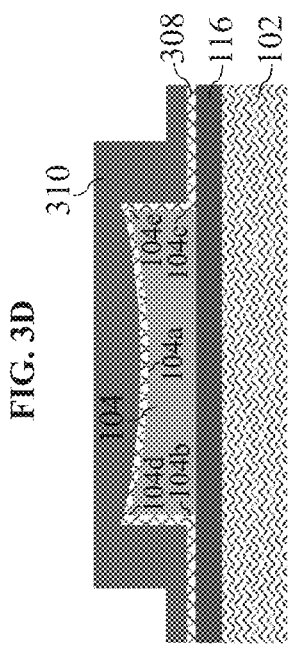
FIG. 3E
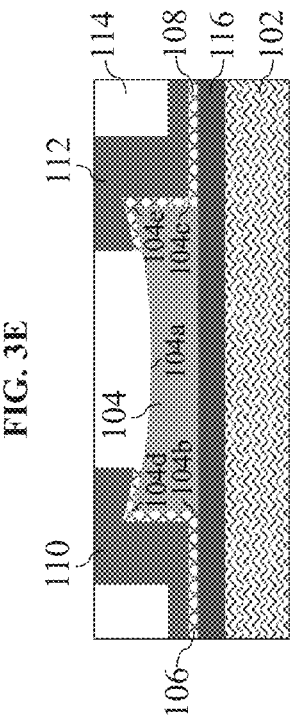
FIG. 3G
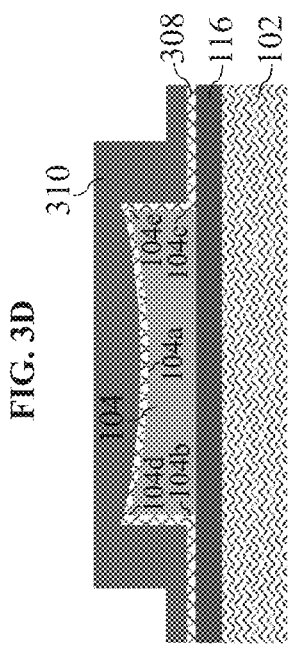
FIG. 3B
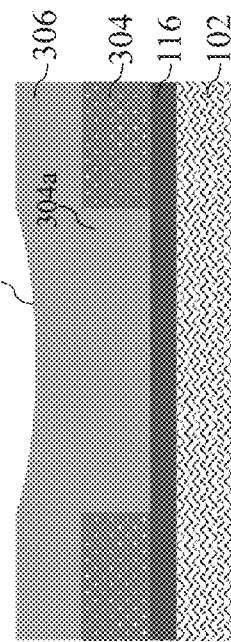
FIG. 3D
FIG. 3F

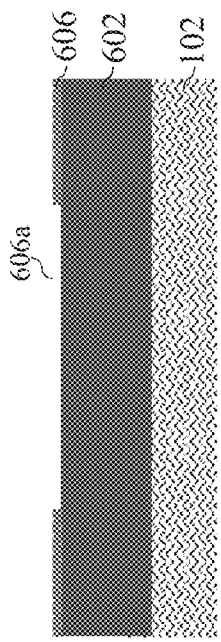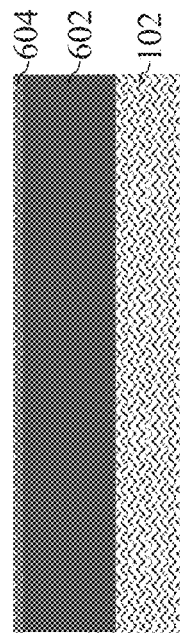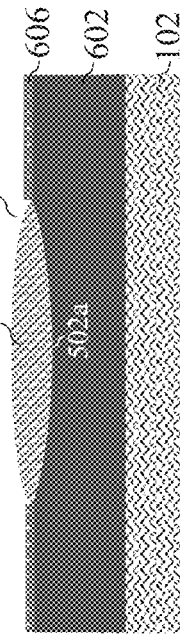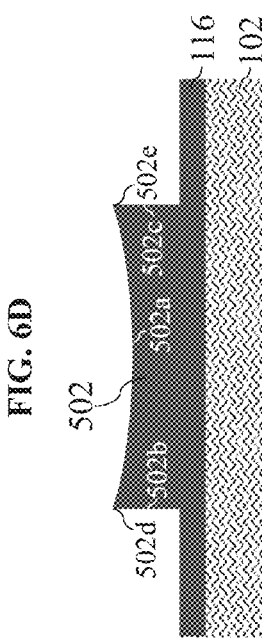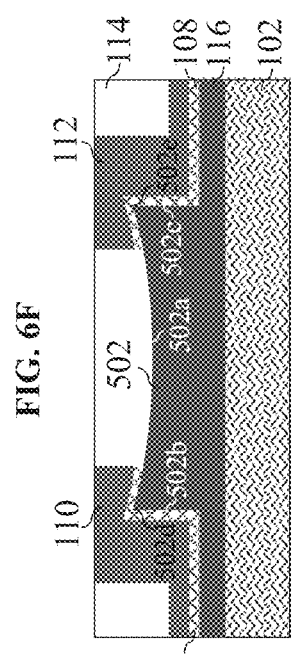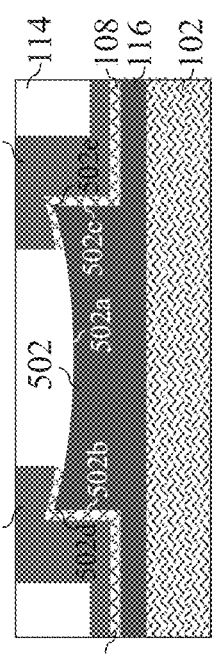

MEMORY DEVICES AND METHODS OF FORMING MEMORY DEVICES

TECHNICAL FIELD

The present disclosure relates generally to memory devices and methods of forming the memory devices.

BACKGROUND

Non-volatile memory devices are often used in various consumer electronic products such as smart phones and tablets. One type of non-volatile memory device is the resistive random access memory (RRAM) device. A RRAM device typically includes a switching material (such as a dielectric material) sandwiched between a top electrode and a bottom electrode. The switching material is normally insulating. However, when a sufficiently high voltage difference (set voltage difference) is applied between the top and bottom electrodes, the switching material can become conductive through the formation of conducting filament(s) therein. The switching material can be made insulating again by breaking the conducting filament(s) with a sufficiently low voltage difference (reset voltage difference) between the top and bottom electrodes. When the switching material is conductive, the switching material has a low resistance and the RRAM device may be referred to as being in a low resistance state (LRS). On the other hand, when the switching material is insulating, the switching material has a high resistance and the RRAM device may be referred to as being in a high resistance state (HRS).

A typical conductive filament formed within the switching material of a RRAM device can be about a few atoms in size. Further, the formation of conducting filament(s) within the switching material is often random in terms of their sizes and locations. For instance, the paths along which the conductive filament(s) are formed in a switching cycle may differ from those in another switching cycle. In addition, incomplete rupture at certain portions of the switching material may occasionally occur, resulting in the formation of differently sized conducting filament(s) in the switching material. Therefore, the resistance of the switching material, and hence, the RRAM device, often varies greatly over different switching cycles.

SUMMARY

According to various non-limiting embodiments, there is provided a memory device including: a substrate; one or more bottom electrodes arranged over the substrate; one or more switching layers arranged over the one or more bottom electrodes; and a plurality of top electrodes arranged over the one or more switching layers. Each of the one or more bottom electrodes may include at least one corner tip facing the one or more switching layers, and an angle of each of the at least one corner tip may be less than ninety degrees.

According to various non-limiting embodiments, there is provided a method of fabricating a memory device, the method including: providing a substrate; forming one or more bottom electrodes over the substrate; forming one or more switching layers over the one or more bottom electrodes; and forming a plurality of top electrodes over the one or more switching layers. Each of the one or more bottom electrodes may include at least one corner tip facing the one or more switching layers, and an angle of each of the at least one corner tip may be less than ninety degrees.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 2A to 2H show simplified cross-sectional views that illustrate a method for fabricating the memory structure of FIG. 1A according to various non-limiting embodiments;

FIGS. 3A to 3G show simplified cross-sectional views that illustrate a method for fabricating a memory structure similar to the memory structure of FIG. 1A according to various non-limiting embodiments;

FIGS. 6A to 6H show simplified cross-sectional views that illustrate a method for fabricating the memory structure of FIG. 5A according to various non-limiting embodiments;

DETAILED DESCRIPTION

Figure 1A:
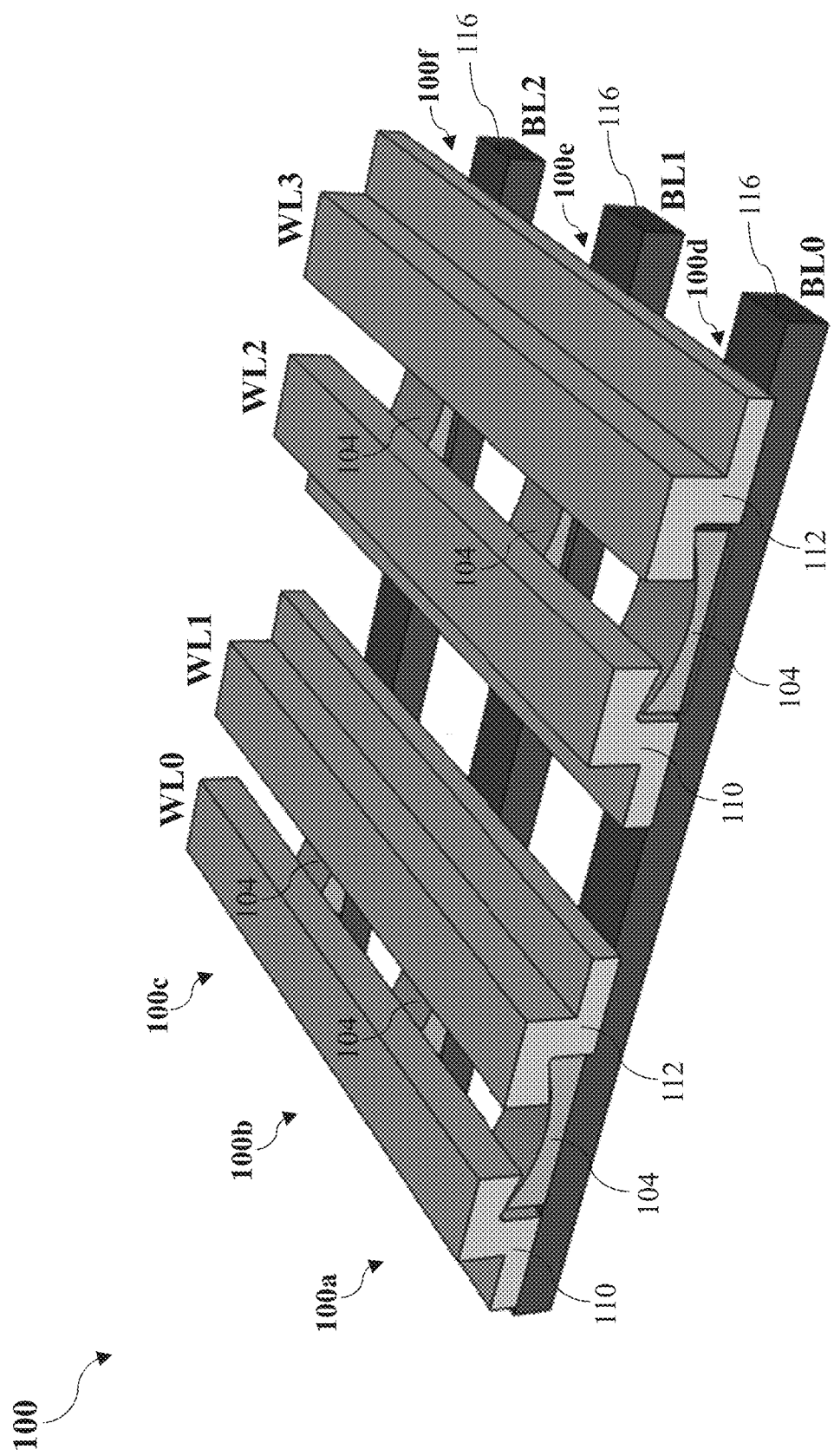
FIG. 1A shows a simplified perspective view of a memory structure according to various non-limiting embodiments, FIGS. 1B, 1C and 1D respectively show a simplified top view, a first simplified cross-sectional view and a second simplified cross-sectional view of the memory structure of FIG. 1A.

The embodiments generally relate to devices, such as semiconductor devices. More particularly, some embodiments relate to memory devices, such as non-volatile memory devices such as RRAM devices in a non-limiting example. The memory devices may be used to form memory structures that may be employed in several applications, for example, but not limited to, neuromorphic computing applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
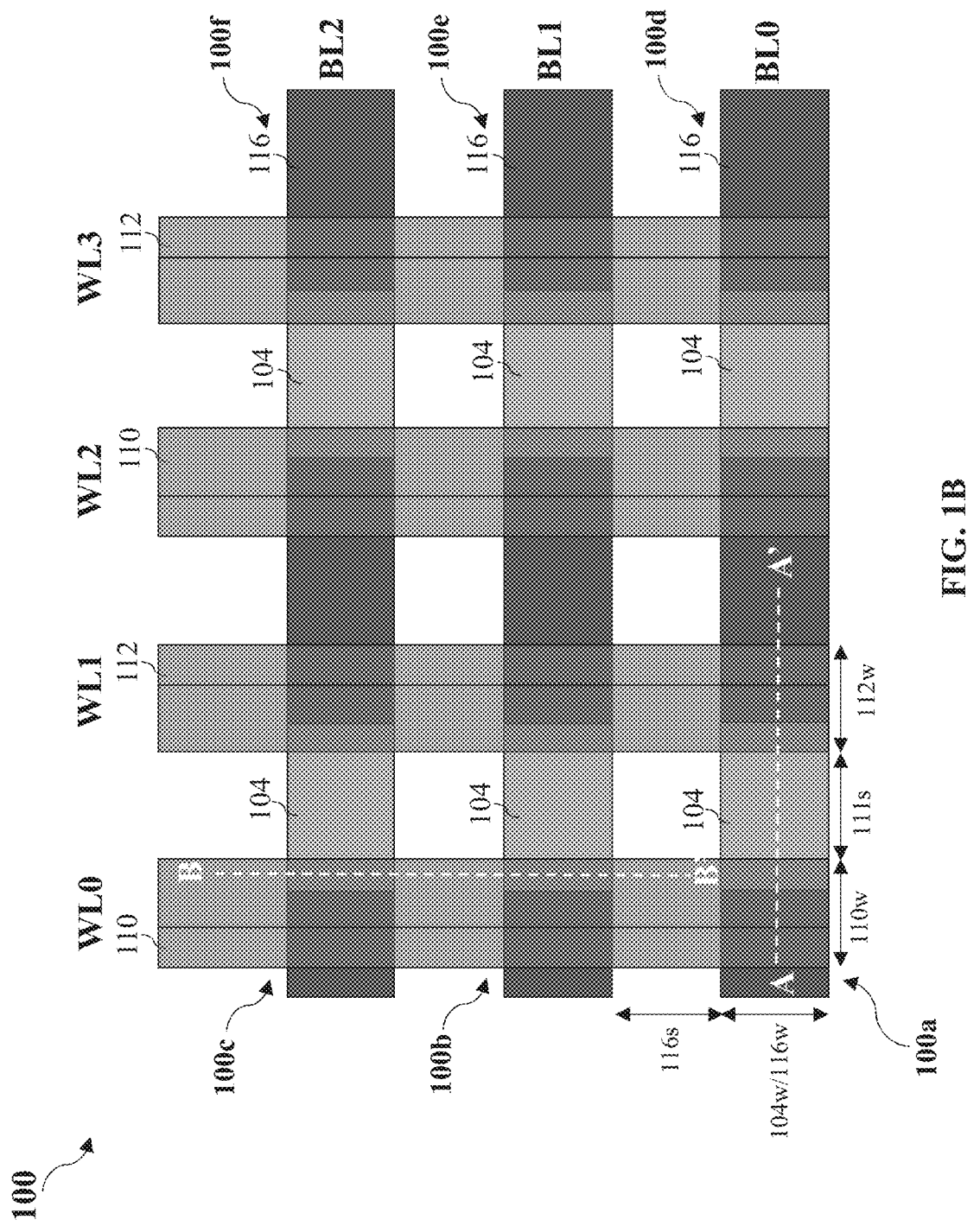
FIG. 1E shows a magnified view of a portion of the cross-sectional view of FIG. 1C.
Figure 1C:
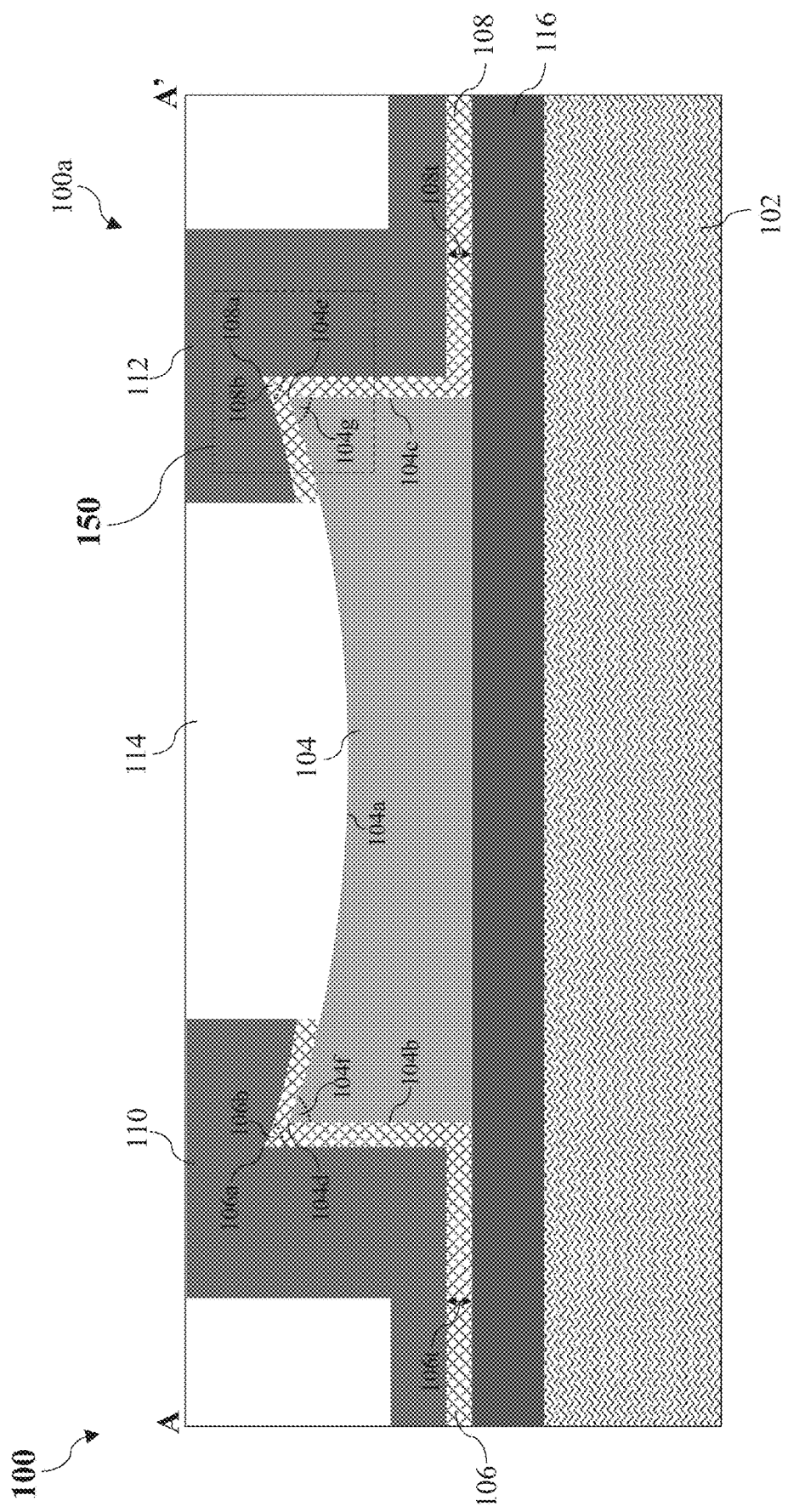
Figure 1D:
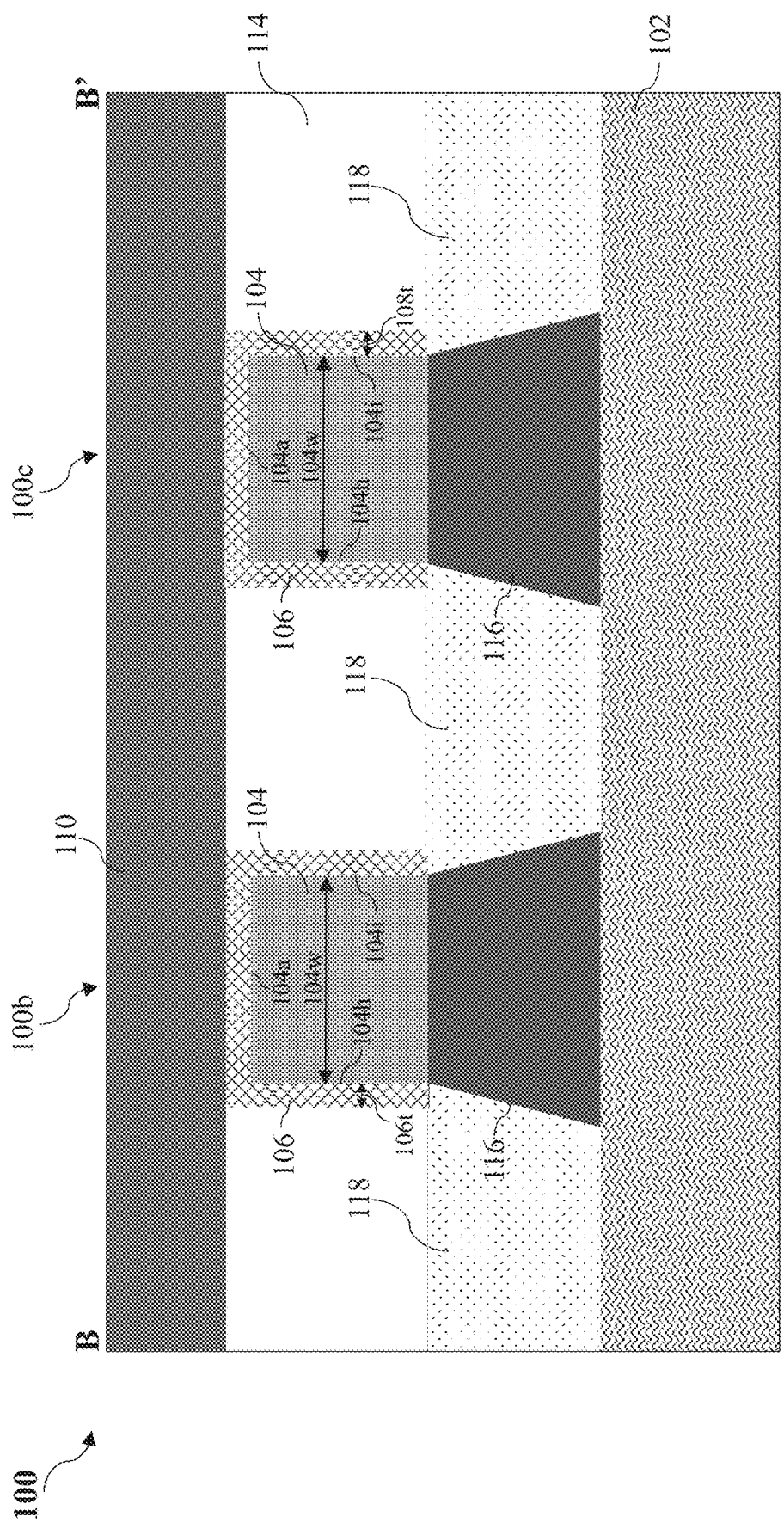

FIG. 1A shows a simplified perspective view of a memory structure 100 according to various non-limiting embodiments, and FIG. 1B shows a simplified top view of the memory structure 100. The memory structure 100 may be a crossbar array and may include a plurality of substantially similar memory devices 100a-100f arranged in multiple rows and columns. For example, as shown in FIGS. 1A and 1B, the memory devices 100a and 100d may be arranged along a same row, whereas the memory devices 100a-100c may be arranged along a same column. In various non-limiting embodiments, each memory device 100a-100f may be a resistive random access memory (RRAM) device. FIG. 1C shows a simplified cross-sectional view of the memory structure 100 (including the memory device 100a) along the line A-A' and FIG. 1D shows a simplified cross-sectional view of the memory structure 100 along the line B-B'.

As shown in FIG. 1C, the memory device 100a may include a substrate 102. The substrate 102 may be a semiconductor substrate, such as, but not limited to, a bulk substrate or a silicon-on-insulator (SOI) substrate. In various non-limiting embodiments, the substrate 102 may include semiconductor material such as silicon, germanium or combinations thereof.

The memory device 100a may further include a single bottom electrode 104 arranged over the substrate 102. The bottom electrode 104 may include a concave top surface 104a, a first side surface 104b and a second side surface 104c. The concave top surface 104a may join the first side surface 104b to form a first corner tip 104d and may join the second side surface 104c to form a second corner tip 104e.

Figure 1E:
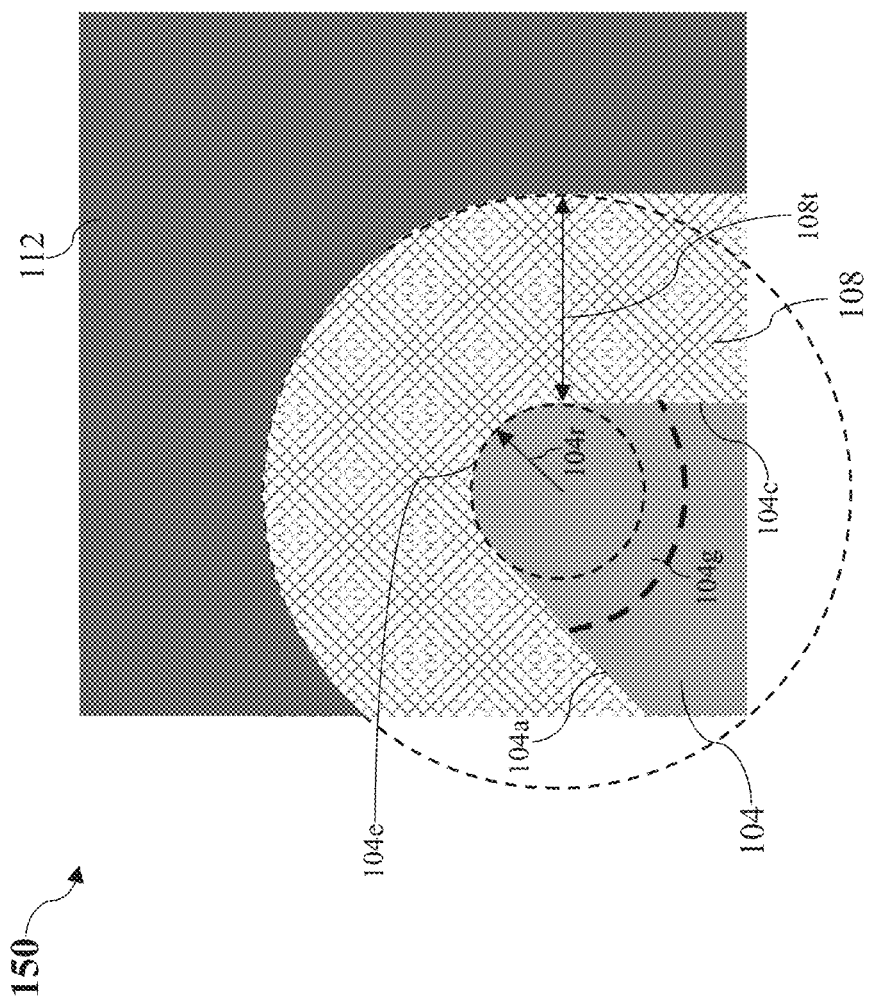

FIG. 1E shows a magnified view of a portion 150 of the memory device 100a. As shown in FIGS. 1C and 1E, each of the first and second corner tips 104d, 104e may have an angle 104f, 104g, and a radius 104r. A sharper corner tip 104d, 104e may have a smaller angle 104f, 104g, and a smaller radius 104r; whereas, a rounder corner tip 104d, 104e may have a larger angle 104f, 104g and a larger radius 104r. In various non-limiting embodiments, an angle 104f, 104g of each of the first and second corner tips 104d, 104e may be less than ninety degrees. The radius 104r may range from about 0.5 nm to about 50 nm (or in other words, about 5 Å to 50 Å) in various non-limiting embodiments, and may range from about 0.5 nm to about 1 nm in another non-limiting embodiment. Note that the radius 104r is not labelled in FIG. 1C to avoid cluttering this figure.

Further, as shown in FIG. 1D, each bottom electrode 104 may have an approximately rectangular cross-section with a substantially constant width 104w. In various non-limiting embodiments, the bottom electrode 104 may include electrode material such as, but not limited to, semiconductor material, metal material, or combinations thereof. The semiconductor material may include, for example, single-crystalline silicon (Si), poly-silicon (Si), germanium (Ge), poly-germanium (Ge), or combinations thereof. The metal material may include, for example, titanium (Ti), tantalum (Ta), titanium nitride (TiN), tantalum nitride (TaN), ruthenium (Ru), platinum (Pt), or combinations thereof.

The memory device 100a may further include a first switching layer 106 and a second switching layer 108. The first and second switching layers 106, 108 may be arranged over the substrate 102 and the bottom electrode 104. In particular, as shown in FIGS. 1C and 1D, each switching layer 106, 108 may extend along a front surface 104h, a back surface 104i, a respective side surface 104b, 104c, and a part of the top surface 104a of the bottom electrode 104. As shown in FIG. 1C, the first switching layer 106 may be arranged over the first corner tip 104d and the second switching layer 108 may be arranged over the second corner tip 104e. Accordingly, the first and second corner tips 104d, 104e may face the first and second switching layers 106, 108 respectively. In the non-limiting embodiment of FIG. 1C, each switching layer 106, 108 may also include a corner tip 106a, 108a with an angle 106b, 108b less than 90 degrees, and the first and second corner tips 104d, 104e may face the corner tips 106a, 108a of the first and second switching layers 106, 108 respectively. In various non-limiting embodiments, each switching layer 106, 108 may include resistive material such as, but not limited to, hafnium oxide ($HfO_2$), magnesium oxide (MgO), tantalum oxide ($TaO_2$), titanium oxide ($TiO_2$), aluminum oxide ($Al_2O_3$), or combinations thereof. In various non-limiting embodiments, each switching layer 106, 108 may have a thickness 106t, 108t ranging from about 2 nm to about 15 nm.

The memory device 100a may further include a plurality of top electrodes including a first top electrode 110 and a second top electrode 112 arranged over the first and second switching layers 106, 108 respectively. The first top electrode 110 may be arranged over the first corner tip 104d and the second top electrode 112 may be arranged over the second corner tip 104e. As shown in FIG. 1C, the first and second top electrodes 110, 112 may each extend along the first and second switching layers 106, 108 respectively, and may thus have a generally S-shaped cross-section. However, the top electrodes 110, 112 may have other types of cross-sections in alternative non-limiting embodiments. In various non-limiting embodiments, the top electrodes 110, 112 may include electrode material such as, but not limited to, semiconductor material, metal material, or combinations thereof. The semiconductor material may include, for example, single-crystalline silicon (Si), poly-silicon (Si), germanium (Ge), poly-germanium (Ge), or combinations thereof. The metal material may include, for example, titanium (Ti), tantalum (Ta), titanium nitride (TiN), tantalum nitride (TaN), ruthenium (Ru), platinum (Pt), or combinations thereof. In some non-limiting embodiments with a low thermal budget, the substrate 102, the bottom electrode 104, and/or the top electrodes 110, 112 may include only germanium or poly-germanium.

As shown in FIG. 1C, the memory device 100a may further include an insulating layer 114 in which the bottom electrode 104, the switching layers 106, 108, and the top electrodes 110, 112 may be arranged. The top electrodes 110, 112 may thus be electrically isolated from each other by a part of the insulating layer 114. Similarly, the first and second switching layers 106, 108 may be electrically isolated from each other by a part of the insulating layer 114. In various non-limiting embodiments, the insulating layer 114 may be a dielectric layer and may include insulating material, such as, but not limited to, silicon oxide, silicon dioxide, silicon nitride, or combinations thereof. In some non-limiting embodiments, the insulating layer 114 may be absent.

In various non-limiting embodiments, the substrates 102 of the plurality of memory devices 100a-100f may be integrally formed as a common substrate 102. Further, the insulating layers 114 of the plurality of memory devices 100a-100f may be integrally formed as a common insulating layer 114. Note that for simplicity, the substrates 102 forming the common substrate 102, the switching layers 106, 108, and the insulating layers 114 forming the common insulating layer 114 of the memory devices 100a-100f are not shown in FIGS. 1A and 1B. Further, the surfaces 104a-104c, 104h, 104i, corner tips 104d-104e, 106a, 108a, and angles 104f, 104g, 106b, 108b are not labelled in FIGS. 1A and 1B to avoid cluttering these figures.

Referring to FIGS. 1A, 1B and 1D, the first top electrodes 110 of the memory devices 100a-100c/100d-100f along a same column may be integrally formed as a common first top electrode, 110 and the second top electrodes 112 of the memory devices 100a-100c/100d-100f along a same column may be integrally formed as a common second top electrode 112. Each common top electrode 110, 112 may extend substantially horizontally across adjacent memory devices 100a-100c/100d-100f along a same column. Further, each common top electrode 110, 112 may function as a word line (WL0-WL3) of the memory structure 100. Accordingly, the memory devices 100a-100c may share a common first word line (WL0) and a common second word line (WL1); whereas the memory devices 100d-100f may share a common third word line (WL2) and a common fourth word line (WL3). The top electrodes 110, 112 may be arranged within the common insulating layer 114, and thus, the top electrodes 110, 112 of adjacent memory devices 100a-100c/100d-100f along a same column may be electrically isolated by the common insulating layer 114. As shown in FIG. 1D, the common insulating layer 114 may also extend between, and thus, electrically isolate the bottom electrodes 104 and switching layers 106, 108 of adjacent memory devices 100a-100c/100d-100f along a same column.

The memory structure 100 may further include a plurality of conductive lines 116 that may function as bit lines (BL0, BL1, BL2). Each conductive line 116 may be arranged within the common substrate 102 and under the bottom electrodes 104 of at least one memory device 100a-100f. For example, as shown in FIGS. 1A and 1D, each conductive line 116 may be arranged under the bottom electrodes 104 of the memory devices 100a, 100d/100b, 100e/100c, 100f along a same row, allowing the memory devices 100a, 100d/100b, 100e/100c, 100f along a same row to share a common bit line (BL0, BL1, BL2). In particular, the memory devices 100a, 100d may share a common first bit line BL0, the memory devices 100b, 100e may share a common second bit line BL1, and the memory devices 100c, 100f may share a common third bit line BL2. In various non-limiting embodiment, the conductive lines 116 may include heavily doped silicon and/or other conductive material, such as, but not limited to metal material. The metal material may include for example, titanium (Ti), tantalum (Ta), titanium nitride (TiN), tantalum nitride (TaN), ruthenium (Ru), platinum (Pt), aluminum (Al), copper (Cu), tungsten (W), or combinations thereof. In the exemplary non-limiting embodiment of FIG. 1D, each conductive line 116 may include a trapezoidal cross-section but the conductive lines 116 may include other types of cross-sections in alternative non-limiting embodiments.

Referring to FIG. 1D, the memory structure 100 may further include a plurality of isolation regions 118 where each isolation region 118 may be arranged within the common substrate 102 and between adjacent conductive lines 116. Accordingly, adjacent conductive lines 116 may be electrically isolated from each other by the isolation region 118 between them. In various non-limiting embodiments, the isolation regions 118 may include shallow trench isolation (STI) regions. In various non-limiting embodiments, the isolation regions 118 may include isolation material, such as, but not limited to, gap fill oxide, nitride, or combinations thereof.

In various non-limiting embodiments, each top electrode 110/112, together with the respective switching layer 106/108, and a portion of the bottom electrode 104 under the switching layer 106/108 may be referred to as a resistive unit (RU), and each memory device 100a-100f may be referred to as a memory cell. Referring to FIG. 1B, in various non-limiting embodiments, a width (e.g. width 104w) of each bottom electrode 104, a width (e.g. width 116w) of each conductive line, a separation (e.g. separation 116s) between adjacent conductive lines 116, a width (e.g. width 110w or width 112w) of each top electrode 110/112 and a separation (e.g. separation 111s) between adjacent top electrodes 110, 112 may be approximately the same and may be approximately equal to F, where F may range from about 5 nm to about 500 nm. In various non-limiting embodiments, a size of each memory device/cell 100a-100f may be calculated as $2F \times 2F = 4F^2$. Note that the widths 104w, 110w, 112w, 116w and the separations 111s, 116s are not labelled in all of FIGS. 1A-1E to avoid cluttering the figures.

FIGS. 2A to 2H show simplified cross-sectional views that illustrate a method for fabricating the memory structure 100 according to various non-limiting embodiments.

Referring to FIG. 2A, the method may include providing the common substrate 102. The method may further include forming the conductive lines 116 and the isolation regions 118 (not shown in FIGS. 2A to 2H) within the substrate 102. In various non-limiting embodiments, the isolation regions 118 may be formed by first etching the substrate 102 using, for example, a photoresist mask to form openings, and then filling the openings with isolation material. The conductive lines 116 may then be formed by heavily doping the parts of the substrate 102 between the isolation regions 118 (using for example, ion implantation where an amount of ions implanted into the substrate 102 may be adjusted to tune the conductivity of the conductive lines 116).

As shown in FIGS. 2A to 2F, the method may further include forming the bottom electrodes 104 of the memory devices 100a-100f over the substrate 102.

Referring to FIGS. 2A and 2B, forming the bottom electrodes 104 may include depositing electrode material 202 over the substrate 102 and forming a hard mask layer 206 over the electrode material 202. The hard mask layer 206 may include a respective opening (e.g. opening 206a) for each bottom electrode 104 to be formed. In various non-limiting embodiments, the hard mask layer 206 with the openings may be formed by depositing hard mask material 204 (such as, but not limited to, silicon nitride) over the substrate 102 and selectively etching the hard mask material 204 (using for example, a photoresist mask) to form the openings.

Referring to FIG. 2C, forming the bottom electrodes 104 may further include oxidising the electrode material 202 through each opening (e.g. opening 206a) of the hard mask layer 202 to form the concave top surface 104a of each bottom electrode 104. The electrode material 202 may be oxidised by depositing an oxidising material (e.g. oxidising material 208) through each opening (e.g. opening 206a) of the hard mask layer 206. In various non-limiting embodiments, the oxidising material 208 may include silicon dioxide.

Referring to FIG. 2D, the hard mask layer 206 may be removed after oxidising the electrode material 202. This may be done by any process as known to those skilled in the art.

Referring to FIG. 2E, forming the bottom electrodes 104 may further include removing portions of the oxidised electrode material 202. In various non-limiting embodiments, this may be done by selectively etching the oxidised electrode material 202 using a self-aligned process. For example, the oxidising materials 208 may be used as masks to etch the oxidised electrode material 202, so that only the portions under the oxidising materials 208 remain. Accordingly, each remaining portion under one of the oxidising materials 208 may include the first side surface 104b and the second side surface 104c of a bottom electrode 104, where the side surfaces 104b, 104b may join the concave top surface 104a to form the corner tips 104d, 104e. A plurality of bottom electrodes 104 under respective oxidising materials 208 may thus be formed.

Referring to FIG. 2F, the oxidising materials 208 may be removed after forming the bottom electrodes 104. This may be done by any process as known to those skilled in the art.

As shown in FIGS. 2G and 2H, the method may further include forming the first and second switching layers 106, 108 over each bottom electrode 104 and the substrate 102, and forming the top electrodes 110, 112 over the respective switching layers 106, 108.

Referring to FIG. 2G, forming the switching layers 106, 108 and the top electrodes 110, 112 may include depositing switching material 210 over the bottom electrodes 104 and the substrate 102, and depositing further electrode material 212 over the switching material 210. Although not shown in FIGS. 2G and 2H, prior to depositing the further electrode material 212, portions of the switching material 210 between adjacent bottom electrodes 104 along a same column may be removed (by for example, selective etching), and insulating material may be deposited between these adjacent bottom electrodes 104. The insulating material may form part of the insulating layer 114.

Referring to FIG. 2H, forming the switching layers 106, 108 and the top electrodes 110, 112 may further include removing portions of the switching material 210 and the further electrode material 212 to form the separate top electrodes 110,112 and the separate switching layers 106, 108 of each memory device 100a-100f. In various non-limiting embodiments, this may be done by etching the switching material 210 and the further electrode material 212 using for example, a photoresist mask. In various non-limiting embodiments, further etching may be performed on the top electrodes 110, 112 to obtain the substantially horizontal and vertical surfaces shown in FIGS. 1A to 1E.

As shown in FIG. 2H, the method may further include forming the remaining part of the insulating layer 114 by depositing further insulating material over the top and bottom electrodes 104, 110, 112 and over the insulating material between the adjacent bottom electrodes 104 along a same column. This may be done using any process as known to those skilled in the art.

The above described order for the method is only intended to be illustrative, and the method is not limited to the above specifically described order unless otherwise specifically stated. Further, note that the corner tips 106a, 108a, the angles 104f, 104g, 106b, 108b, the radius 104r and the thicknesses 106t, 108t are not labelled in FIGS. 2A to 2H to avoid cluttering the figures.

In some alternative non-limiting embodiments, there may be provided a memory structure similar to the memory structure 100 but without the isolation regions 118. In this memory structure, the conductive lines 116 may instead be electrically isolated from one another by insulative regions including insulative material such as, but not limited to, silicon oxide, silicon dioxide, silicon nitride or combinations thereof. FIGS. 3A to 3G show simplified cross-sectional views that illustrate a method for fabricating such a memory structure according to various non-limiting embodiments.

Referring to FIG. 3A, the method may include providing the common substrate 102. The method may further include forming the conductive lines 116 and the insulative regions (not shown in FIGS. 3A to 3G) over the substrate 102. In various non-limiting embodiments, an insulative material may first be deposited over the substrate 102 and then etched to form trenches therein. Conductive material may then be deposited over the insulative material such that the trenches are filled with the conductive material. A planarization/polishing process (e.g. chemical mechanical planarization/polishing (CMP) process) may then be used to remove the conductive material above the insulative material and the openings. This may thus form the conductive lines 116 and the insulative regions. However, other processes as known to those skilled in the art may also be used to form the conductive lines 116 and the insulative regions in alternative non-limiting embodiments.

As shown in FIGS. 3A to 3E, the method may further include forming the bottom electrodes 104 of the memory devices 100a-100f over the substrate 102.

Referring to FIGS. 3A and 3B, forming the bottom electrodes 104 may include forming a hard mask layer 304 over the substrate 102, where the hard mask layer 304 may include a respective opening (e.g. opening 304a) for each bottom electrode 104 to be formed. In various non-limiting embodiments, the hard mask layer 304 may be formed by depositing hard mask material 302 (such as, but not limited to silicon nitride, silicon dioxide, or combinations thereof) over the substrate 102 and selectively etching the hard mask material 302 (using, for example, a photoresist mask) to form the openings.

Referring to FIG. 3C, forming the bottom electrodes 104 may further include depositing electrode material 306 over the substrate 102 and the hard mask layer 304, such that a portion of the electrode material 306 is deposited into each opening (e.g. opening 304a) of the hard mask layer 304. In various non-limiting embodiments, a top surface of the deposited electrode material 306 may include concave portions 306a aligned with respective openings of the hard mask layer 304. The concave portions 306 may be formed because of the interaction between the electrode material 306 with the substrate 102 within each opening of the hard mask layer.

Referring to FIG. 3D, forming the bottom electrodes 104 may also include removing portions of the electrode material 306. In various non-limiting embodiments, the electrode material 306 may be planarized to remove portions of the electrode material 306 over the hard mask layer 304. A polishing/planarizing process (such as, but not limited to a CMP process or the CMP process in combination with an etch-back process) may be used, where the planarization of the electrode material 306 may stop at the hard mask layer 304. As shown in FIG. 3D, after removing portions of the electrode material 306, a bottom electrode 104 may be formed within each opening (e.g. opening 304a) of the hard mask layer 304. The concave top surface 104a of each bottom electrode 104 may be aligned with the respective opening (e.g. opening 304a) of the hard mask layer 304 along a vertical direction perpendicular to the substrate 102. Similar to the formation of the concave portions 306a as described above, the concave top surface 104a of each bottom electrode 104 may be formed due to the interaction of the electrode material 306 remaining in each opening (e.g. opening 304a) and the substrate 102.

As shown in FIG. 3E, the method may further include removing the hard mask layer 304. This may be done using any process as known to those skilled in the art.

Referring to FIGS. 3F and 3G, the method may further include forming the first and second switching layers 106, 108, the top electrodes 110, 112 and the insulating layer 114 in a manner similar to that described above with reference to FIGS. 2G and 2H. For example, this may include depositing switching material 308 and further electrode material 310, and removing portions of these materials 308, 310.

The above described order for the method is only intended to be illustrative, and the method is not limited to the above specifically described order unless otherwise specifically stated. Further, note that the corner tips 106a, 108a, the angles 104f, 104g, 106b, 108b, the radius 104r and the thicknesses 106t, 108t are not labelled in FIGS. 3A to 3G to avoid cluttering the figures.

In various non-limiting embodiments, the method described with reference to FIGS. 2A to 2H may be referred to as a back-end-of-line (BEOL) process; whereas, the method described with reference to FIGS. 3A to 3G may be referred to as a front-end-of-line (FEOL) process. The process to form the bottom electrodes 104 described with reference to FIGS. 3A to 3E may be interchangeable with the process to form the bottom electrodes 104 described with reference to FIGS. 2A to 2F. For example, in a non-limiting embodiment, the electrode material may include poly-silicon and the bottom electrodes 104 may be formed with the process described with reference to FIGS. 3A to 3E over the substrate 102 with the isolation regions 118.

Figure 4:
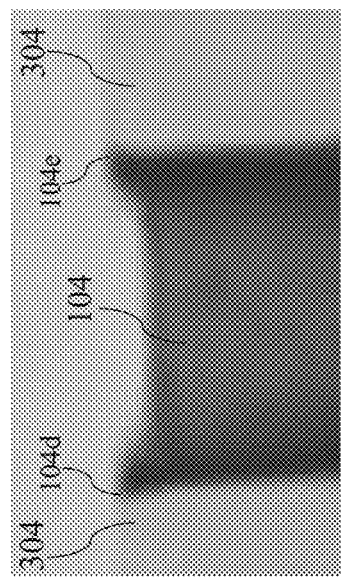
FIG. 4 shows a transmission electron microscope (TEM) image of a part of a structure formed in the method of FIGS. 3A to 3G.

FIG. 4 shows a transmission electron microscope (TEM) image of a part of a bottom electrode 104 and the hard mask layer 304 of FIG. 3D. As shown by the TEM image of FIG. 4, the bottom electrode 104 may include the first and second corner tips 104d, 104e.

The corner tips 104d, 104e of each memory device 100a-100f may help to confine the formation of conductive filament(s) and increase the density of the conductive filament(s) formed between the top electrodes 110, 112 and the bottom electrode 104. This can in turn reduce the resistance distribution/variability and thus, the read current distribution/variability of the memory device 100a-100f. In addition, the electric field between the top electrodes 110, 112 and the bottom electrode 104 of the memory device 100a-100f may also be enhanced.

When a voltage difference is applied between one of the top electrodes 110, 112 and the bottom electrode 104, an electric field may be formed at the corner tip 104d, 104e under the top electrode 110, 112. As the radius 104r of the tip 104d, 104e increases, the electric field at the tip 104d, 104e may decrease. For example, when the radius 104r of the corner tip 104d, 104e is approximately 5 Å, the electric field may be about 55 MV/cm, and when the radius 104r of the corner tip 104d, 104e is about 50 Å, the electric field may be about 10 MV/cm. As compared to a typical RRAM device with a substantially planar bottom electrode having approximately right-angled corners, the electric field when the radius is about 50 Å may be about 2 times larger whereas the electric field when the radius is about 5 Å may be about 10 times larger. In other words, a bottom electrode 104 having sharper corner tips 104d, 104e with smaller angles 104f, 104g and radiuses 104r may help to achieve a higher electric field in the memory device 100a-100f.

Figure 5A:
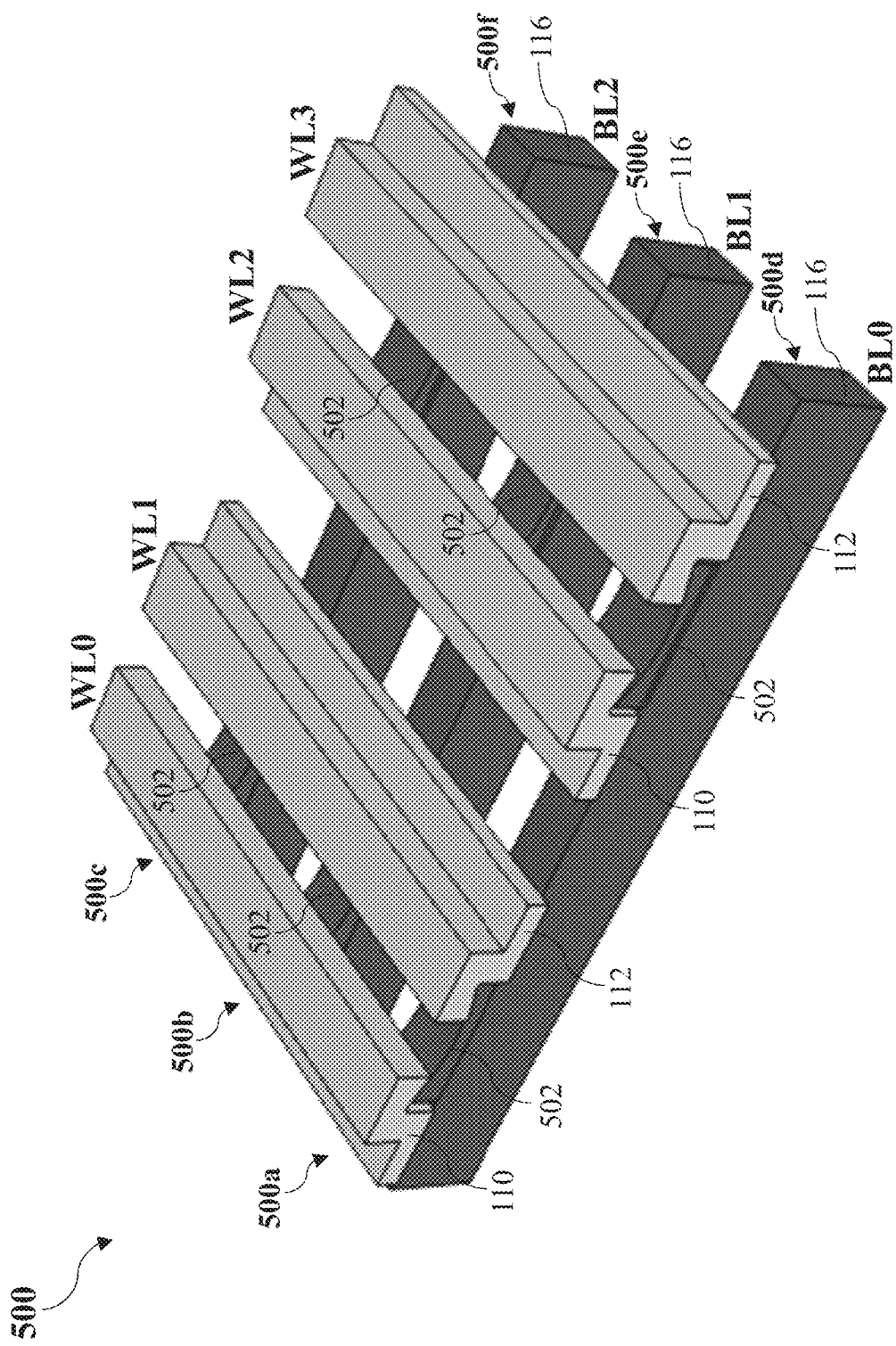
FIG. 5A shows a simplified perspective view of a memory structure according to an alternative non-limiting embodiment, and FIGS. 5B, 5C and 5D respectively show a simplified top view, a first simplified cross-sectional view and a second simplified cross-sectional view of the memory structure of FIG. 5A.
Figure 5B:
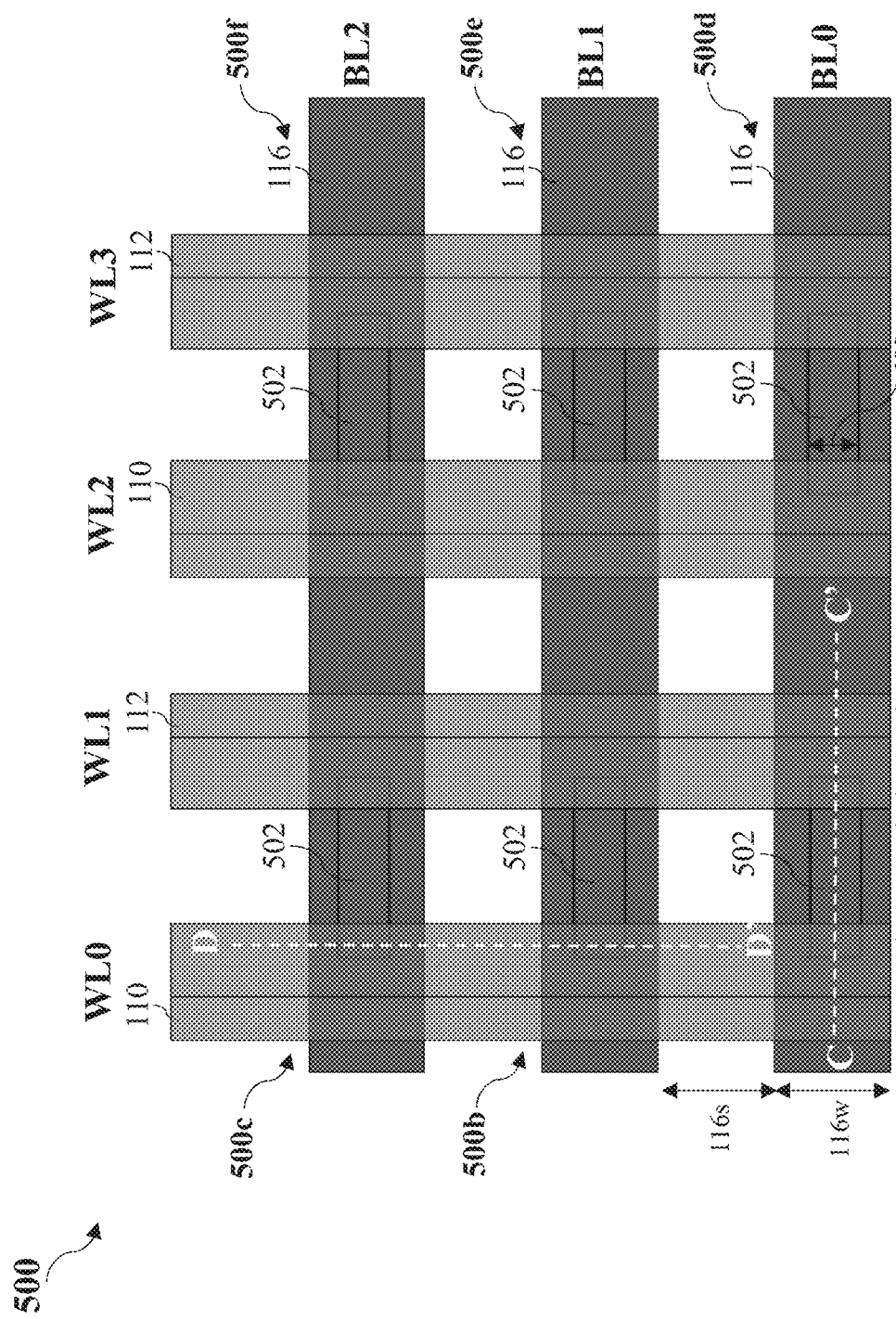
Figure 5C:
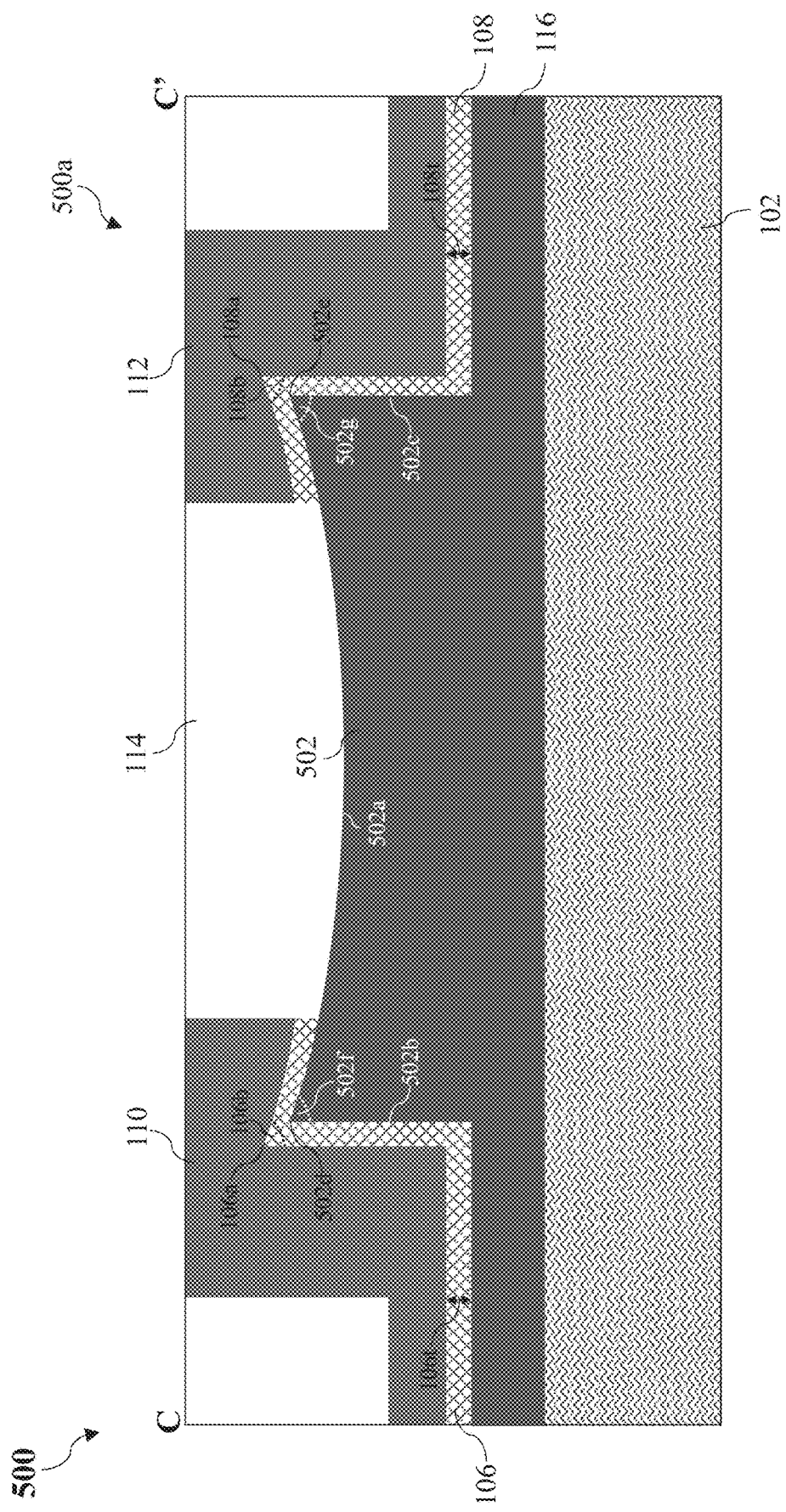
Figure 5D:
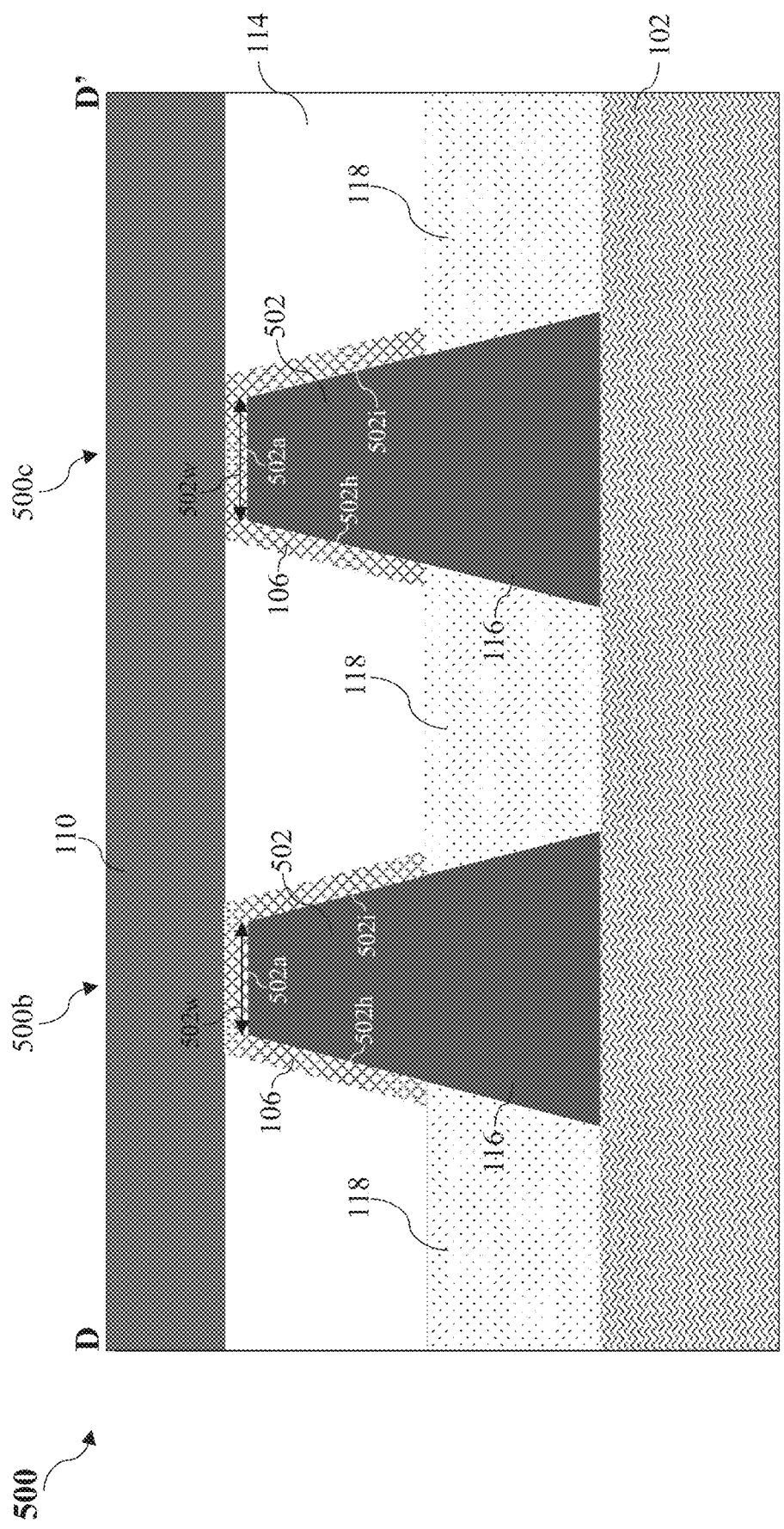

FIG. 5A shows a simplified perspective view of a memory structure 500 according to an alternative non-limiting embodiment. FIG. 5B shows a simplified top view of the memory structure 500. FIGS. 5C and 5D respectively show simplified cross-sectional views of the memory structure 500 along the line C-C' and along the line D-D'. The memory structure 500 is similar to the memory structure 100, and thus the common features are labelled with the same reference numerals and need not be discussed.

As shown in FIG. 5A, the memory structure 500 may also include a plurality of memory devices 500a-500f, where each memory device 500a-500f may include a single bottom electrode 502. Referring to FIG. 5C, each bottom electrode 502 may (similar to the bottom electrodes 104 in the memory structure 100) include a concave top surface 502a, side surfaces 502b, 502c, and corner tips 502d, 502e with angles 502f, 502g less than 90 degrees.

However, the bottom electrode 502 of each memory device 500a-500f of the memory structure 500 may include a material that is the same as the conductive lines 116. As shown in FIG. 5D, each bottom electrode 502 of the memory structure 500 may be integrally formed with a respective conductive line 116 as a single conductive element that may be referred to as a fin. Further, while each bottom electrode 104 of the memory structure 100 may include a substantially rectangular cross-section, each bottom electrode 502 of the memory structure 500 may include a substantially trapezoidal cross-section with sloping front and back surfaces 502h, 502i as shown in FIG. 5D. The substantially trapezoidal cross-section of each bottom electrode 502 may taper towards the top electrode 110. In various non-limiting embodiments, the narrowest portion of each bottom electrode 502 may have a width 502w that may be substantially smaller than the width 104w of the bottom electrodes 104 in the memory structure 100. Due to this smaller width 502w as compared to the width 104w, the filaments formed between the bottom electrodes 502 and the respective top electrodes 110/112 may be better confined in the memory structure 500 as compared to those formed between the bottom electrodes 104 and the respective top electrodes 110/112 in the memory structure 100.

FIGS. 6A to 6H show simplified cross-sectional views that illustrate a method for fabricating the memory structure 500 according to various non-limiting embodiments.

Referring to FIG. 6A, the method may include providing the common substrate 102. The method may further include forming conductive regions (e.g. conductive region 602) and the isolation regions 118 (not shown in FIGS. 6A to 6H) over the substrate 102. The conductive regions (e.g. conductive region 602) may be formed by depositing conductive material (e.g. silicon) over the substrate 102 and a mask layer over the conductive material. The mask layer may include silicon nitride or silicon dioxide, and may be patterned to cover only some portions of the conductive material. Exposed portions of the conductive material may then be removed by for example, selective etching, and the remaining portions of the conductive material may form the conductive regions. The isolation regions 118 may be formed by depositing isolation material between the conductive regions and performing an etch-back process on the isolation material. However, other processes as known to those skilled in the art may also be used to form the conductive regions (e.g. conductive region 602) and the isolation regions 118.

As shown in FIGS. 6A to 6F, the method may further include forming the bottom electrodes 502 of the memory devices 500a-500f over the substrate 102.

Referring to FIGS. 6A and 6B, forming the bottom electrodes 502 may include forming a hard mask layer 606 over the conductive regions 602, where the hard mask layer 606 may include a respective opening (e.g. opening 606a) over each conductive region 602, for each bottom electrode 502 to be formed. In various non-limiting embodiments, the hard mask layer 606 with the openings may be formed by depositing hard mask material 604 (such as, but not limited to silicon nitride) over the conductive regions 602, and selectively etching the hard mask material 604 (using, for example, a photoresist mask) to form the openings.

Referring to FIG. 6C, forming the bottom electrodes 502 may further include oxidising the conductive regions 602 through the openings of the hard mask layer 606 to form the concave top surfaces 502a of the bottom electrodes 502. The conductive regions 602 may be oxidised by depositing an oxidising material (e.g. oxidising material 608) through each opening (e.g. opening 606a) of the hard mask layer 606. In various non-limiting embodiments, the oxidising material 608 may include silicon dioxide.

Referring to FIG. 6D, the hard mask layer 606 may be removed after oxidising the conductive regions 602. This may be done by any process as known to those skilled in the art.

Referring to FIG. 6E, forming each bottom electrode 502 may further include removing a portion of each oxidised conductive region 602. In various non-limiting embodiments, this may be done by selectively etching each oxidised conductive region 602 using the oxidising material 608 over the region 602 as a mask. In other words, the oxidised conductive region 602 may be etched such that only the portion under the oxidising material 608 remains. This remaining portion may thus include the first side surface 502b and the second side surface 502c of the bottom electrode 502, where the side surfaces 502b, 502c join the concave top surface 502a to form the corner tips 502d, 502e.

Referring to FIG. 6F, the oxidising materials 608 may be removed after forming the bottom electrodes 502. This may be done by any process as known to those skilled in the art.

Referring to FIGS. 6G and 6H, the method may further include forming the first and second switching layers 106, 108, the top electrodes 110, 112 and the insulating layer 114 in a manner similar to that described with reference to FIGS. 2G and 2H. For example, this may include depositing switching material 610 and further electrode material 612, and removing portions of these materials 610, 612.

The above described order for the method is only intended to be illustrative, and the method is not limited to the above specifically described order unless otherwise specifically stated. Further, note that the corner tips 106a, 108a, the angles 502f, 502g, 106b, 108b, and the thicknesses 106t, 108t are not labelled in FIGS. 6A to 6H to avoid cluttering the figures.

Figure 7:
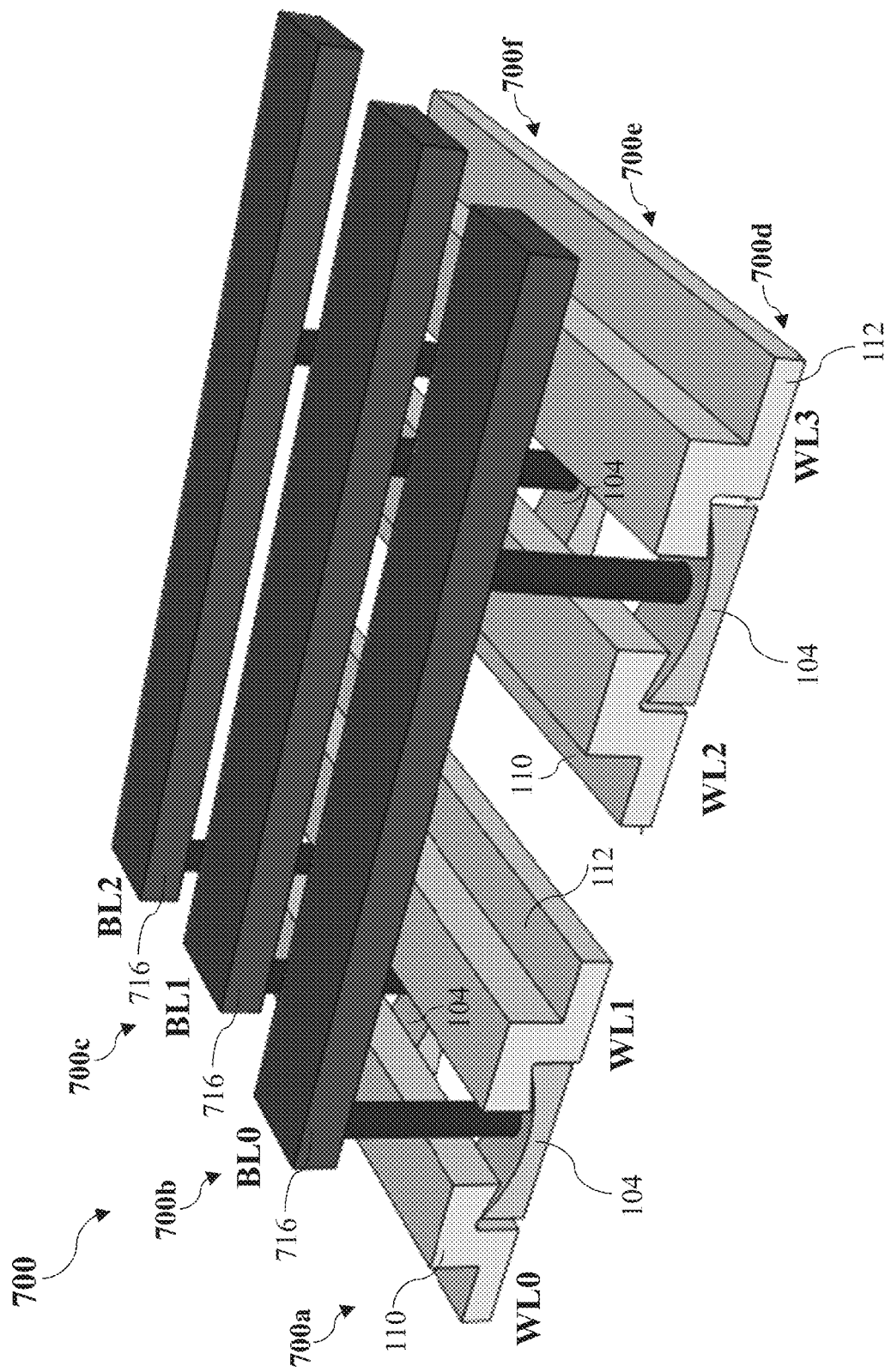
FIG. 7 shows a simplified perspective view of a memory structure according to an alternative non-limiting embodiment.

FIG. 7 shows a simplified perspective view of a memory structure 700 according to an alternative non-limiting embodiment. The memory structure 700 is similar to the memory structure 100, and thus the common features are labelled with the same reference numerals and need not be discussed.

As shown in FIG. 7, as compared to the memory structure 100, the memory structure 700 may also include a plurality of conductive lines 716 which may serve as bit lines (B0, B1, B2). However, each conductive line 716 of the memory structure 700 may be arranged over (instead of under) and electrically connected to the bottom electrode(s) 104 of at least one memory device 700a-700f. Although not shown in FIG. 7, in various non-limiting embodiments, an insulating layer may be arranged between the common substrate 102 and the bottom electrodes 104 of the memory structure 700. This insulating layer may help to electrically isolate the bottom electrodes 104 of different memory devices 700a-700f.

Although the memory structures 100, 500, 700 are shown in the figures as including six memory devices 100a-100f, 500a-500f, 700a-700f, it is understood by one skilled in the art that the memory structures 100, 500, 700 may include any number of memory devices. In a non-limiting example, the memory structure 100/500/700 may include a single memory device.

Figure 8:
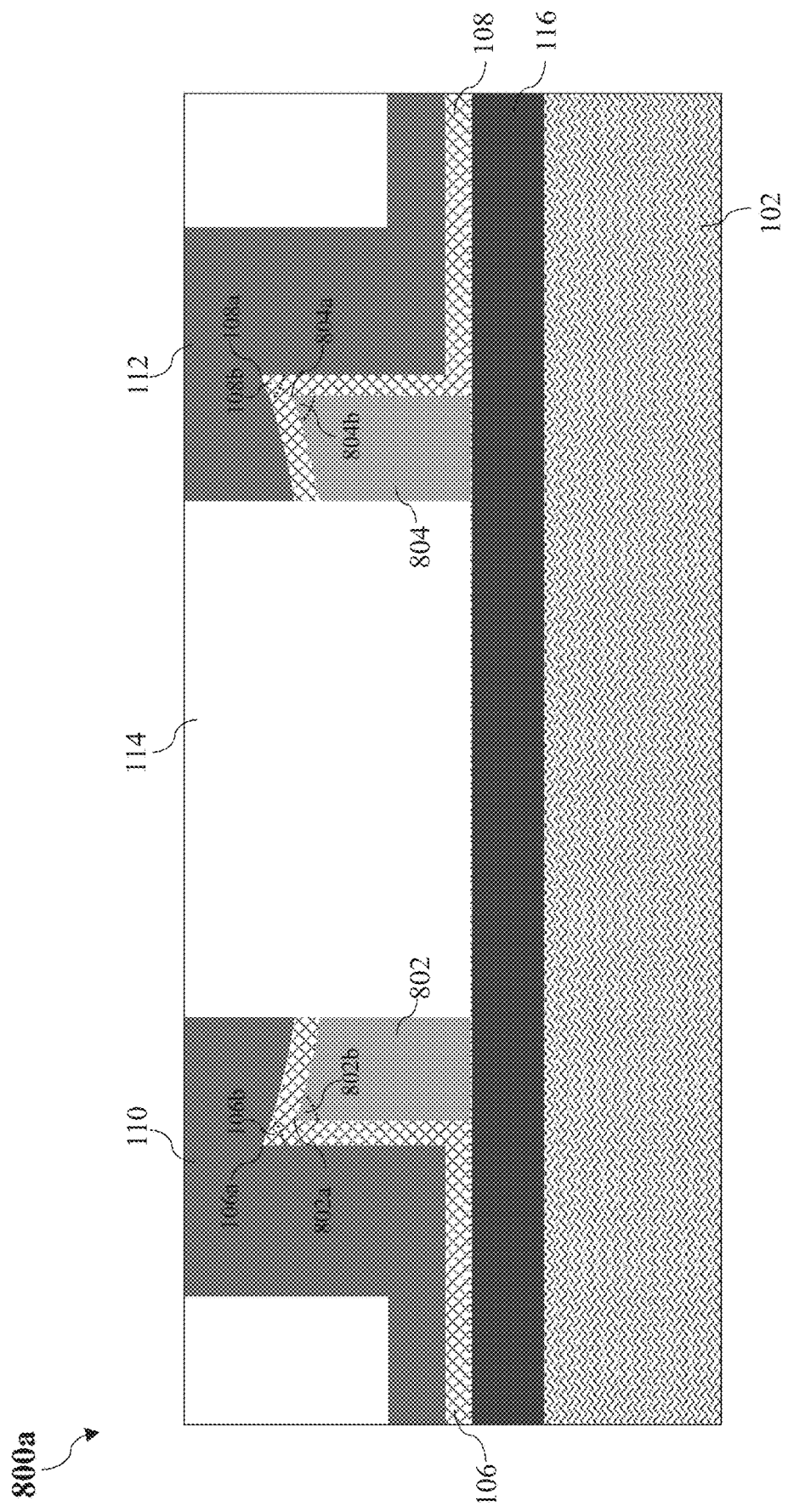
FIG. 8 shows a simplified cross-sectional view of a memory device in a memory structure according to an alternative non-limiting embodiment.

Further, although the memory structures 100, 500, 700 are described above as including memory devices 100a-100f, 500a-500f, 700a-700f with a single bottom electrode 104/502, one or more of the memory devices 100a-100f, 500a-500f, 700a-700f may include more than one bottom electrode in alternative non-limiting embodiments. FIG. 8 shows a simplified cross-sectional view of such a memory device 800a. The memory device 800a is similar to the memory device 100a, and thus the common features are labelled with the same reference numerals and need not be discussed. As shown in FIG. 8, the memory device 800a may include a first bottom electrode 802 and a second bottom electrode 804 electrically isolated from the first bottom electrode 802 by the insulating layer 114. The first bottom electrode 802 may include a first corner tip 802a having an angle 802b less than 90 degrees and the second bottom electrode 804 may include a second corner tip 804a having an angle 804b less than 90 degrees. The first and second switching layers 106, 108 may be arranged over the first and second bottom electrodes 802, 804, respectively, with the first corner tip 802a facing the first switching layer 106 and the second corner tip 802b facing the second switching layer 108. In the exemplary non-limiting embodiment of FIG. 8, the first and second corner tips 802a, 804a may face the corner tips 106a, 108a of the first and second switching layers 106, 108 respectively.

Further, in some alternative non-limiting embodiments, at least one of the memory devices 100a-100f, 500a-500f, 700a-700f of the memory structures 100, 500, 700 may include a single switching layer over the single bottom electrode 104/502 instead of two electrically isolated switching layers 106, 108. In a non-limiting example, the single switching layer may extend along the entire top surface 104a/502a of the bottom electrode 104/502.

In addition, in some alternative non-limiting embodiments, at least one of the memory devices 100a-100f, 500a-500f, 700a-700f may include a single bottom electrode 104 having a single corner tip (instead of two corner tips 104d, 104e) with an angle less than 90 degrees. In some alternative non-limiting embodiments, each bottom electrode of at least one of the memory devices 100a-100f, 500a-500f, 700a-700f may include more than two corner tips, with each corner tip having an angle less than 90 degrees.

In various alternative non-limiting embodiments, at least one of the memory devices 100a-100f, 500a-500f, 700a-700f of the memory structures 100, 500, 700 may include bottom electrode(s) 104, 502 formed of a semiconductor material, and the memory device 100a-100f, 500a-500f, 700a-700f may further include a metal layer between the bottom electrode(s) 104, 502 and the switching layer(s) 106, 108. The metal layer may extend across an entire top surface 104a/502a of each bottom electrode 104/502, and along each switching layer 106, 108. In various non-limiting embodiments, the metal layer may include metal material, such as, but not limited to, titanium (Ti), tantalum (Ta), titanium nitride (TiN), tantalum nitride (TaN), ruthenium (Ru), platinum (Pt) or combinations thereof. In various non-limiting embodiments, this metal layer may be formed prior to depositing the switching material 210/308/610.

In addition, in some alternative non-limiting embodiments, the top electrodes 110, 112 may not extend substantially horizontally across bottom electrodes 104/502 of adjacent memory devices 100a-100c/100d-100f, 500a-500c/500d-500f, 700a-700c/700d-700f along a same column. Instead, the top electrodes 110, 112 may extend between the bottom electrodes 104 of the adjacent memory devices 100a-100c/100d-100f, 500a-500c/500d-500f, 700a-700c/700d-700f. In these alternative non-limiting embodiments, during fabrication of the memory structure 100/500/700, insulating material may not be deposited between the bottom electrodes 104 of the adjacent memory devices 100a-100c/100d-100f, 500a-500c/500d-500f, 700a-700c/700d-700f along each column prior to depositing the further electrode material 212/310/612.

Further, although the cross-sectional views of FIGS. 1C and 5C show each top electrode 110, 112 as having a substantially flat top surface and a substantially vertical side surface joining the top surface, in alternative non-limiting embodiments, the top electrodes 110, 112 may instead have different types of surfaces, for example, surfaces that conform more closely to the shapes of the switching layers 106, 108. In these embodiments, during fabrication of the memory structure 100/500/700, the further etching on the top electrodes 110, 112 after removing portions of the further electrode material 212/310/612 may be omitted.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
 a substrate;
 a bottom electrode arranged over the substrate, the bottom electrode including a first bottom electrode portion and a second bottom electrode portion;
 one or more switching layers arranged over the bottom electrode, the one or more switching layers including a first switching layer and a second switching layer; and
 one or more top electrodes arranged over the one or more switching layers, the one or more top electrodes including a first top electrode and a second top electrode;
 wherein the first top electrode is arranged over the first switching layer, the first switching layer is arranged conformally over the first bottom electrode portion, the second top electrode is arranged over the second switching layer portion, the second switching layer is arranged conformally over the second bottom electrode portion,
 wherein each of the first and second bottom electrode portions comprises a corner tip facing the first and second switching layers respectively, and wherein an angle of each corner tip is less than ninety degrees,
 wherein each of the first and second switching layers comprises a corner tip with an angle less than ninety degrees,
 wherein each of the first and second bottom electrode portions includes a concave top surface, a side surface, and a flat bottom surface, wherein the concave top surface joins the side surface to form the corner tip, and
 wherein the corner tip of the first bottom electrode portion faces away from the corner tip of the second bottom electrode portion.

2. The memory device of claim 1, further comprising a metal layer comprising metal material between the bottom electrode and the switching layer.

3. A memory structure comprising a plurality of memory devices, wherein each memory device comprises:
 a substrate;
 a bottom electrode arranged over the substrate, the bottom electrode including a first bottom electrode portion and a second bottom electrode portion;
 one or more switching layers arranged over the bottom electrode, the one or more switching layers including a first switching layer and a second switching layer; and a one or more top electrodes arranged over the one or more switching layers, the one or more top electrodes including a first top electrode and a second top electrode;

wherein the first top electrode is arranged over the first switching layer, the first switching layer is arranged conformally over the first bottom electrode portion, the second top electrode portion is arranged over the second switching layer, the second switching layer is arranged conformally over the second bottom electrode portion, wherein each of the first and second bottom electrode portions comprises a corner tip facing the first and second switching layers respectively, and wherein an angle of each corner tip is less than ninety degrees, wherein each of the first and second switching layers comprises a corner tip with an angle less than ninety degrees, wherein each of the first and second bottom electrode portions includes a concave top surface, a side surface, and a flat bottom surface, wherein the concave top surface joins the side surface to form the corner tip, and wherein the corner tip of the first bottom electrode portion faces away from the corner tip of the second bottom electrode portion, and wherein the substrates of the plurality of memory devices are integrally formed as a common substrate.

4. The memory structure of claim 3, further comprising a plurality of conductive lines, wherein each conductive line is arranged under the bottom electrode of at least one memory device of the plurality of memory devices.

5. The memory structure of claim 4, wherein each conductive line is arranged within the common substrate and wherein the memory structure further comprises a plurality of isolation regions, wherein each isolation region is arranged within the common substrate and between adjacent conductive lines of the plurality of conductive lines.

6. The memory structure of claim 4, wherein the bottom electrode of each memory device comprises a material that is the same as the plurality of conductive lines.

7. The memory structure of claim 3, further comprising a plurality of conductive lines, wherein each conductive line is arranged over and electrically connected to the bottom electrode of at least one memory device of the plurality of memory devices.

8. The memory structure of claim 7, further comprising an insulating layer arranged between the common substrate and the bottom electrode.

9. A method of fabricating a memory device, the method comprising:
providing a substrate;
forming a bottom electrode over the substrate, the bottom electrode including a first bottom electrode portion and a second bottom electrode portion;
forming one or more switching layers over the bottom electrode, the one or more switching layers including a first switching layer and a second switching layer; and
forming one or more top electrodes over the one or more switching layers, the one or more top electrodes including a first top electrode and a second top electrode;
wherein the first top electrode is arranged over the first switching layer, the first switching layer is arranged conformally over the first bottom electrode portion, the second top electrode is arranged over the second switching layer, the second switching layer is arranged conformally over the second bottom electrode portion,
wherein each of the first and second bottom electrode portions comprises a corner tip facing the first and second switching layers respectively, and wherein an angle of each corner tip is less than ninety degrees,
wherein each of the first and second switching layers comprises a corner tip with an angle less than ninety degrees,
wherein each of the first and second bottom electrode portions includes a concave top surface, a side surface, and a flat bottom surface, wherein the concave top surface joins the side surface to form the corner tip, and
wherein the corner tip of the first bottom electrode faces away from the corner tip of the second bottom electrode portion.

10. The method of claim 9, wherein forming the bottom electrode comprises:
depositing electrode material over the substrate;
forming a hard mask layer with an opening over the electrode material; and
oxidising the electrode material through the opening of the hard mask layer to form the concave top surfaces of the first and second bottom electrode portions.

11. The method of claim 10, wherein forming the bottom electrode further comprises:
removing a portion of the oxidised electrode material such that a remaining portion of the oxidised electrode material comprises the side surface of the first bottom electrode portion joining the concave top surface of the first bottom electrode to form the corner tip of the first bottom electrode portion and the side surface of the second bottom electrode portion joining the concave top surface of the second bottom electrode portion to form the corner tip of the second bottom electrode portion.

12. The method of claim 10, wherein forming the bottom electrode comprises:
forming a hard mask layer with an opening over the substrate;
depositing electrode material over the hard mask layer such that a portion of the electrode material is deposited into the opening of the hard mask layer; and
removing a portion of the electrode material to form the bottom electrode, wherein a concave top surface of the bottom electrode is aligned with the opening of the hard mask layer along a vertical direction perpendicular to the substrate.

13. The method of claim 12, wherein removing the portion of the electrode material to form the bottom electrode comprises planarizing the electrode material to remove the portion of the electrode material over the hard mask layer to form the bottom electrode within the opening of the hard mask layer.

14. The method of claim 10, wherein the memory device is a memory device of a memory structure comprising at least one conductive line and the bottom electrode comprises a material that is the same as the at least one conductive line, and wherein forming the bottom electrode comprises:
forming a conductive region over the substrate;
forming a hard mask layer with an opening over the conductive region; and
oxidising the conductive region through the opening of the hard mask layer to form a concave top surface of the bottom electrode.

15. The memory device of claim 1, wherein the bottom electrode is continuous so that that first bottom electrode portion and the second bottom electrode portion are physically connected.

16. The memory device of claim 1, further comprising:
a conductive line arranged under the bottom electrode;
wherein the first bottom electrode portion and the second bottom electrode portion are electrically connected to the conductive line.

17. The memory device of claim 16, wherein the conductive line comprises a trapezoidal cross-section.

18. The memory device of claim 17, wherein the trapezoidal cross-section of the conductive line extends from a trapezoidal cross-section of the bottom electrode.

19. The memory device of claim 1, wherein each corner tip comprises a radius, the radius ranging from about 0.5 nm to about 50 nm.

20. The memory device of claim 15, further comprising an insulating layer, wherein a portion of the insulating layer is arranged over the bottom electrode and wherein the first top electrode and the second top electrode are electrically isolated from each other by the portion of the insulating layer and the first switching layer and the second switching layer are electrically isolated from each other by the portion of the insulating layer.

\* \* \* \* \*